(12) United States Patent
Chang et al.

(10) Patent No.: US 9,263,252 B2
(45) Date of Patent: Feb. 16, 2016

(54) METHOD OF PROTECTING AN INTERLAYER DIELECTRIC LAYER AND STRUCTURE FORMED THEREBY

(71) Applicants: Chun-Wei Chang, Taoyuan (TW); Yi-An Lin, Taipei (TW); Neng-Kuo Chen, Sinshih Township (TW); Sey-Ping Sun, Hsinchu (TW); Clement Hsingjen Wann, Carmel, NY (US); Yu-Lien Huang, Jhubei (TW)

(72) Inventors: Chun-Wei Chang, Taoyuan (TW); Yi-An Lin, Taipei (TW); Neng-Kuo Chen, Sinshih Township (TW); Sey-Ping Sun, Hsinchu (TW); Clement Hsingjen Wann, Carmel, NY (US); Yu-Lien Huang, Jhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/735,949

(22) Filed: Jan. 7, 2013

(65) Prior Publication Data
US 2014/0191333 A1 Jul. 10, 2014

(51) Int. Cl.
*H01L 29/78* (2006.01)
*H01L 21/336* (2006.01)
*H01L 21/02* (2006.01)
*H01L 29/66* (2006.01)

(52) U.S. Cl.
CPC ........ *H01L 21/022* (2013.01); *H01L 29/66545* (2013.01)

(58) Field of Classification Search
CPC ................. H01L 29/66545; H01L 21/823842; H01L 21/823864; H01L 21/823878; H01L 21/823871
USPC ........................... 257/368, 369; 438/585, 589
See application file for complete search history.

(56) References Cited

U.S. PATENT DOCUMENTS

| | | | | |
|---|---|---|---|---|
| 8,357,978 B1 * | 1/2013 | Baars et al. | | 257/368 |
| 2013/0105903 A1 * | 5/2013 | Chang et al. | | 257/369 |
| 2013/0309856 A1 * | 11/2013 | Jagannathan et al. | | 438/587 |

* cited by examiner

*Primary Examiner* — Whitney T Moore
*Assistant Examiner* — Scott Stowe
(74) *Attorney, Agent, or Firm* — Hauptman Ham, LLP

(57) ABSTRACT

This description relates to a method including forming an interlayer dielectric (ILD) layer and a dummy gate structure over a substrate and forming a cavity in a top portion of the ILD layer. The method further includes forming a protective layer to fill the cavity. The method further includes planarizing the protective layer. A top surface of the planarized protective layer is level with a top surface of the dummy gate structure. This description also relates to a semiconductor device including first and second gate structures and an ILD layer formed on a substrate. The semiconductor device further includes a protective layer formed on the ILD layer, the protective layer having a different etch selectivity than the ILD layer, where a top surface of the protective layer is level with the top surfaces of the first and second gate structures.

20 Claims, 3 Drawing Sheets

METHOD OF PROTECTING AN INTERLAYER DIELECTRIC LAYER AND STRUCTURE FORMED THEREBY

BACKGROUND

Interlayer dielectric (ILD) layers are formed between adjacent transistor gates to provide electrical insulation between the adjacent transistor gates. During a manufacturing process, e.g., a gate last process, the ILD layers are subjected to multiple etching, planarizing and cleaning processes, which can damage the ILD layers and form cavities in the ILD layer. In some instances, during metallization processes the cavities become filled with conductive material which reduces the electrical insulation provided by the ILD layers.

The reduced electrical insulation can lead to short circuits between a source/drain of a transistor and the conductive materials filling the cavities in the ILD layers. In some instances, the short circuits render a semiconductor device inoperable or irreparably damage surrounding circuits.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
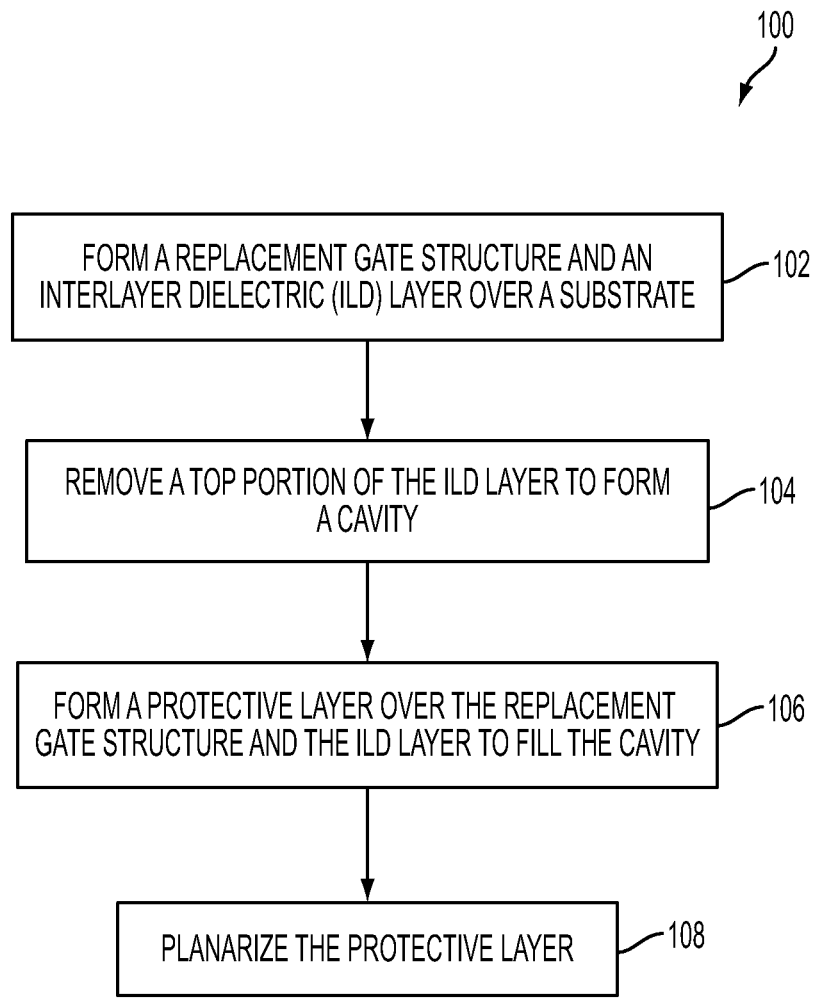
FIG. 1 is a flow chart for a method of protecting an interlayer dielectric (ILD) layer, according to one or more embodiments.

FIG. 1 is a flow chart of a method 100 of protecting an inter-level dielectric (ILD) layer. Method 100 begins with step 102 in which a replacement gate structure and an ILD layer are formed over a substrate. In some embodiments, the replacement gate structure is formed by depositing a blanket layer of polysilicon on the substrate. The blanket layer of polysilicon is then patterned to form discrete replacement gate structures with spaces between adjacent replacement gate structures. In some embodiments, the patterning is performed by a lithography/etching process or other suitable process. The ILD layer is deposited over the replacement gate structures and fills the spaces between adjacent replacement gate structures. The ILD layer is then planarized so that a top surface of the ILD layer is level with respect to a top surface of the replacement gate structures. In some embodiments, the order of forming the ILD layer and the replacement gate structure is reversed, i.e., the ILD layer is formed prior to the replacement gate structure. In some embodiments, the ILD layer is called an ILD0 layer.

Figure 2A:
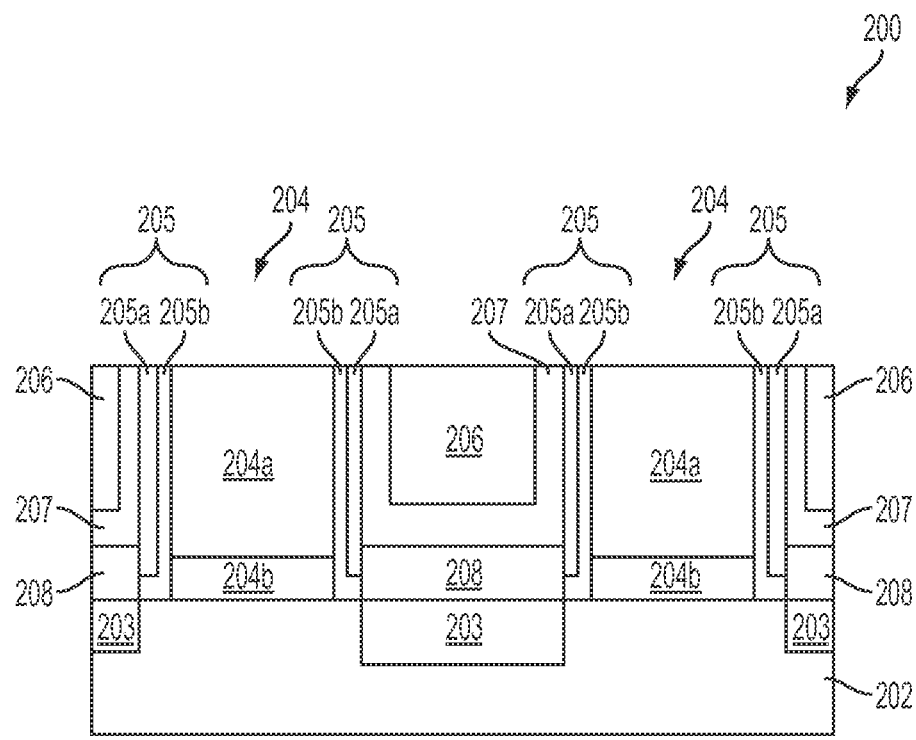
FIGS. 2A-2D are cross sectional views of a semiconductor device during various stages of the method of FIG. 1, in accordance with one or more embodiments.

FIG. 2A is a cross-sectional view of a semiconductor device 200 following step 102. Semiconductor device 200 includes a substrate 202. Substrate 202 includes source/drain regions 203 in the substrate. A replacement gate structure 204 is disposed over substrate 202 between source/drain regions 203. Replacement gate structure includes a dummy gate electrode 204a and a gate oxide 204b. Sidewall spacers 205 are formed along sidewalls of replacement gate structure 204 to electrically isolate the replacement gate structures. Sidewall spacers include a nitride layer 205a and an oxide layer 205b positioned between the nitride layer and replacement gate structure 204 as well as between the nitride layer and substrate 202. An ILD layer 206 is also formed over substrate 202. ILD layer 206 is formed between adjacent replacement gate structures 204 to provide electrical insulation between the adjacent replacement gate structures. A contact etch stop layer (CESL) 207 is formed between ILD layer 206 and substrate 202 as well as between the ILD and sidewall spacers 205. A silicide layer 208 is disposed between CESL 207 and source/drain regions 203.

In some embodiments, semiconductor device 200 includes transistors such as fin field effect transistors (FinFET) or metal oxide semiconductor (MOS) transistors.

In some embodiments, substrate 202 comprises an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 202 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

Source/drain regions 203 include portions of substrate 202 which have a dopant type opposite to a dopant type of the substrate. In some embodiments, source/drain regions 203 include p-type dopants such as boron, boron di-fluoride or other suitable dopants. In some embodiments, source/drain regions 203 include n-type dopants such as arsenic, phosphorous or other suitable dopants. In some embodiments, source/drain regions 203 are formed by ion implantation. In some embodiments, source/drain regions 203 are formed by an annealing process. In some embodiments, source/drain regions 203 are formed by removing a portion of substrate 202 and forming a material in the opening in the substrate.

Replacement gate structure 204 comprises a dummy gate 204a and a gate oxide 204b. In some embodiments, replacement gate structure 204 only includes dummy gate 204a. In some embodiments, dummy gate 204a comprises polysilicon. In some embodiments, dummy gate 204a comprises silicon dioxide or metal and high-k dielectric materials. Suitable high-k dielectric materials include comprises silicon dioxide ($SiO_2$), silicon oxynitride (SiON), hafnium dioxide ($HfO_2$), zirconium dioxide ($ZrO_2$), combinations thereof or other suitable materials. In some embodiments, dummy gate comprises multiple layers.

In some embodiments, gate oxide 204b is a dummy gate oxide and is removed along with dummy gate 204a. In some embodiments, the gate oxide 204b comprises a dielectric material. In embodiments, gate oxide 204b comprises a high-k dielectric material. A high-k dielectric material has a dielectric constant (k) higher than the dielectric constant of silicon dioxide. In some embodiments, the high-k dielectric material has a k value greater than 3.9. In some embodiments, the high-k dielectric material has a k value greater than 8.0. In some embodiments, the gate dielectric comprises silicon dioxide ($SiO_2$), silicon oxynitride (SiON), hafnium dioxide ($HfO_2$), zirconium dioxide ($ZrO_2$) or other suitable materials. In some embodiments, the gate dielectric has a thickness ranging from 0.5 nanometers (nm) to 4.0 nm.

Sidewall spacers 205 separate replacement gate structure 204 from ILD layer 206. Sidewall spacers 205 include a nitride layer 205a positioned closest to ILD layer 206 and an oxide layer 205b between the nitride layer and replacement gate structure 204. In some embodiments, sidewall spacers 205 comprise a single layer. In some embodiments having a single layer sidewall spacer, the sidewall spacers 205 comprise silicon nitride (SiN). In some embodiments, the sidewall spacers are formed using an anisotropic etching process.

ILD layer 206 is disposed between adjacent replacement gate structures 204. In some embodiments, ILD layer 206 is called ILD0 because ILD layer 206 is the closest ILD layer to substrate 202. In some embodiments, ILD layer 206 comprises silicon oxide and/or low-k dielectric materials with a dielectric constant less than about 4. Suitable low-k dielectric materials include fluorinated silica glass (FSG); carbon doped silicon oxide, SiN, silicon oxynitride (SiON), silicon boron nitride (SiBN), silicon carbon boron nitride (SiCBN), BLACK DIAMOND® (Applied Materials of Santa Clara, Calif.), xerogel, aerogel, amorphous fluorinated carbon, parylene, bis-benzocyclobutenes (BCB), SILK® (Dow Chemical, Midland, Mich.), polyimide, porous polymeric materials, other suitable materials or combinations thereof. In some embodiments, ILD layer 206 is formed by chemical vapor deposition (CVD), self-aligned CVD (SACVD), low pressure CVD (LPCVD), atomic layer deposition (ALD), plasma enhanced ALD (PEALD), plasma enhanced CVD (PECVD) or other suitable formation methods. For example, in some embodiments, ILD layer 206 has a thickness ranging from 300 nanometers (nm) to 450 nm. In some embodiments, ILD layer 206 has a width ranging from 25 nm to 75 nm.

CESL 207 is formed between ILD layer 206 and substrate 202 as well as between the ILD layer and sidewall spacers 205. In some embodiments, CESL 207 comprises SiN, SiON, silicon carbide (SiC), silicon carbon nitride (SiCN), boron nitride (BN), SiBN, SiCBN, combinations thereof, or other suitable materials. In some embodiments, CESL 207 is formed by gas cluster ion beams (GCIBs), PVD, ALD, sputter, CVD, or other suitable processes. In some embodiments, CESL 207 comprises a same material as ILD layer 206. In some embodiments, CESL 207 comprises a different material from ILD layer 206.

Silicide layer 208 is formed between CESL 207 and substrate 202. In some embodiments, silicide layer 208 In some embodiments, silicide layer 208 is a self-aligned silicide (salicide) layer. In some embodiments, silicide layer 208 comprises nickel (Ni), copper (Cu), titanium (Ti), cobalt (Co), tungsten (W), platinum (Pt) or other suitable material. In some embodiments, silicide layer 208 has a thickness ranging from about 100 Angstroms (Å) to about 1000 Å.

Returning to FIG. 1, method 100 continues with step 104 in which a top portion of the ILD layer is removed to form a cavity. In some embodiments, the top portion of the ILD layer is removed using a photolithography and etching process. In some embodiments, the etching process is a wet etching process using a diluted hydro-fluoric acid solution as an etchant. In some embodiments, the etching process is a dry etching process, a reactive ion etching (RIE) process or a plasma etching process.

Figure 2B:
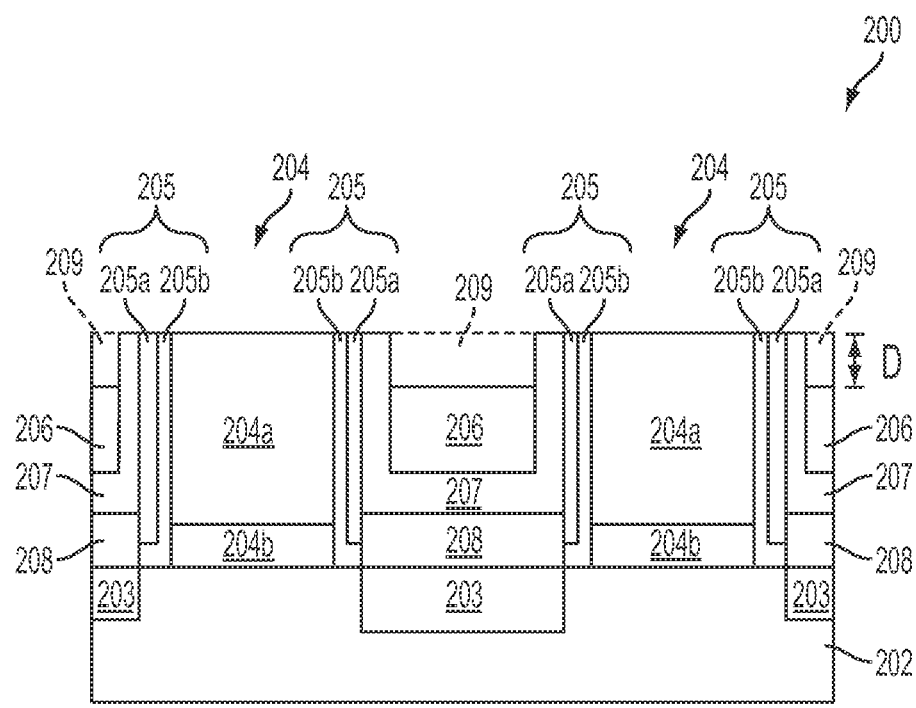

FIG. 2B is a cross-sectional view of semiconductor device 200 following step 104. A top portion of ILD layer 206 (FIG. 2A) was removed to form a cavity 209. Cavity 209 has a depth D below a top surface of replacement gate structure 204. Stated another way, a top surface of ILD layer 206 is located depth D below the top surface of replacement gate structure 204 following step 104. Depth D ranges from about 20 nanometers (nm) to about 50 nm. In some embodiments, if depth D is less than about 20 nm, an effectiveness of a protective layer 210 (FIGS. 2C and 2D) to protect ILD layer 206 is decreased. In some instances, protective layer 208 is etched through, exposing ILD layer 206, by subsequent cleaning and etching processes if depth D is less than 20 nm. In some embodiments, if depth D is greater than about 50 nm, processing time to form vias to connect to source/drain features in substrate 202 is unnecessarily increased. The increased processing time reduces production throughput and thereby increases production costs. A width of cavity 209 is the same as a width of ILD layer 206. If the width of cavity 209 is less than ILD layer 206, peripheral portions of the ILD layer will be removed during subsequent processing which will limit the effectiveness of protective layer 210 in some instances. In some embodiments, the depth of the cavity ranges from about 20% of the thickness of ILD layer 206 to about 100% of the ILD layer. If the depth of the cavity is less than about 20% of the thickness of ILD layer 206, the shallow depth of the cavity would fail to provide sufficient protection after the planarization process of step 108, in some embodiments.

Returning to FIG. 1, method 100 continues with step 106 in which a protective layer is formed over the replacement gate structure and the ILD layer and fills the cavity. In some embodiments, the protective layer is formed by atomic layer deposition. In some embodiments, the protective layer is formed by physical vapor deposition (PVD), chemical vapor deposition (CVD), sputtering or other suitable processes.

Figure 2C:
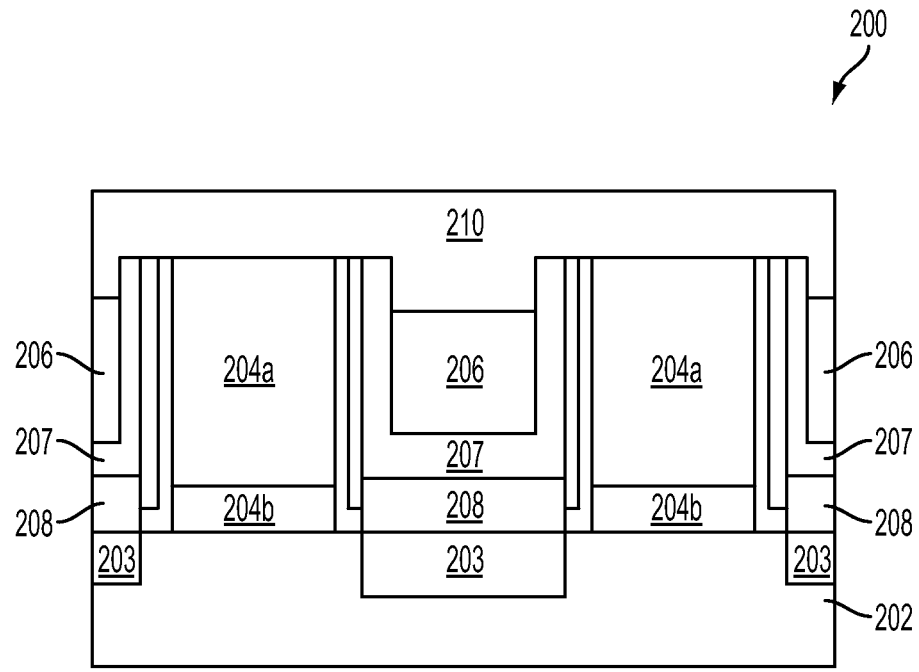

FIG. 2C is a cross-sectional view of semiconductor device 200 following step 106. Protective layer 210 is formed over replacement gate structure 204 and ILD layer 206. Protective layer 210 fills cavity 209 (FIG. 2B).

In some embodiments, ILD layer 206 and replacement gate structure 204 comprise materials which have approximately the same etch selectivity, such that an etchant used to etch one of the ILD layer or the replacement gate structure will also etch the other at substantially the same rate. Some etching or cleaning processes intended to remove material from replacement gate structure 204 unintentionally remove material from ILD layer 206 due to the similar etch selectivity between the two elements. The resulting damage to ILD layer 206 negatively impacts the performance of circuits which include the damaged ILD layer. In order to prevent unintentional removal of material from ILD layer 206, protective layer 210 is formed over the ILD layer which has an etch selectivity different than that of replacement gate structure 204. During etching or cleaning processes intended to remove material from replacement gate structure 204, little or no material will be unintentionally removed from protective layer 210. In some embodiments, protective layer 210 comprises SiN, SiC, SiCN or other suitable materials.

Returning to FIG. 1, method 100 continues with step 108 in which the protective layer is planarized. The protective layer is planarized so that a top surface of the protective layer is level with a top surface of the dummy gate structure. In some embodiments, the protective layer is planarized using a chemical mechanical polishing (CMP) process.

Figure 2D:
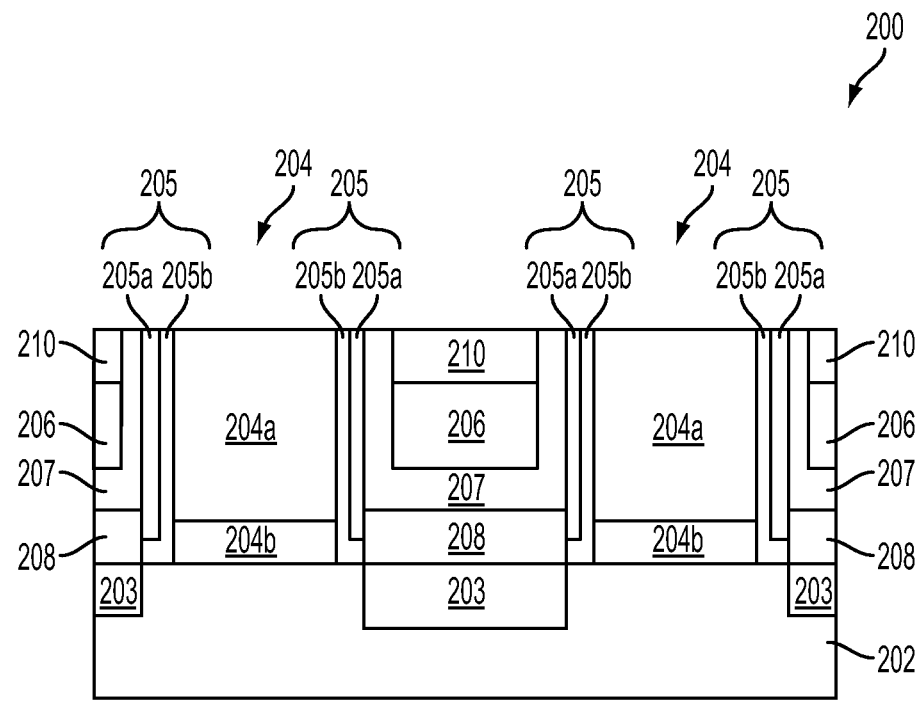

FIG. 2D is a cross-sectional view of semiconductor device 200 following step 108. Protective layer 210 is planarized so that a top surface of the protective layer is level with the top surface of replacement gate structure 204. ILD layer 206 is protected from unintentional material removal during subsequent etching and cleaning processes by protective layer 210.

Following method 100 several processing steps are used to complete formation of a completed semiconductor device. In some embodiments, the steps include removal of dummy gate electrode 204a and forming a gate electrode. In some embodiments, the gate electrode includes a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. In some embodiments, the conductive material of the gate electrode layer is doped or undoped depending on design requirements of field effect transistor devices of an integrated circuit. In some embodiments, the gate electrode includes a work function layer tuned to have a proper work function for enhanced performance of the field effect transistor devices. For example, where the field effect transistor devices are NFETs, the work function layer includes an n-type work function metal (n-metal), such as Ta, TiAl, TiAlN, TaCN, other n-type work function metal, or a combination thereof. Where the field effect transistor device is a PFET, the work function layer includes a p-type work function metal (p-metal), such as TiN, TaN, other p-type work function metal, or combination thereof. In some embodiments, a conductive layer, such as an aluminum layer, is formed over the work function layer, such that the gate electrode includes a work function layer disposed over a gate dielectric layer and a conductive layer disposed over the work function layer. In some embodiments, additional steps further include forming lightly doped drain (LDD) regions and channel formation as well as forming conductive contacts electrically coupled with source/drain regions 203 in substrate 202.

The impact of protective layer 210 is discussed using an example of the removal of dummy gate 204a. In some embodiments, removal of dummy gate 204a is performed by a combination of wet and dry etching processes. During the etching processes, the material of dummy gate 204a is removed by a combination of wet and dry etching. In some embodiments, the wet etching is performed using a diluted hydrofluoric acid bath with 100 parts of deionized water to 1 part of hydrofluoric acid. In embodiments where ILD layer 206 comprises silicon oxide, an etch rate of the ILD layer material in the diluted hydrofluoric acid is approximately 110 Angstroms per minute (Å/min). In contrast, SiN has an etch rate in the diluted hydrofluoric acid of approximately 31.1 Å/min and SiCN has an etch rate of approximately 2.3 Å/min. The etch rate of SiN is more than 70% lower than the etch rate of ILD layer 206. The etch rate of SiCN is about 98% lower than the etch rate of ILD layer 206. During the dry etching process, the etch rate of ILD layer 206 is approximately 38 Å/min, while the etch rate of SiN is about 3.1 Å/min and the etch rate of SiCN is about 0.58 Å/min. The etch rate of SiN is about more than 90% lower than the etch rate of ILD layer 206 and the etch rate of SiCN is more than 98% less than the etch rate of the ILD layer. The result is that any recess formed in protective layer 208 by the removal of dummy gate 204a is smaller than a recess that would be formed in ILD layer 206 which is not protected by protective layer 210.

In some instances where no protective layer 210 is used and a recess is formed in ILD layer 206, the ILD layer and adjacent metallized transistor gates are subjected to an additional planarization process to remove the cavities formed during removal of dummy gate 204a because the cavities are filled with conductive material during the metallization process. The planarization process removes material from both ILD layer 206 and the adjacent metallized transistor gates and thereby reduces a height of the adjacent metallized transistor gates. In some instances, the planarization process exposes a portion of an underlying epi-layer or substrate. In some instances, the underlying epi-layer or substrate is damaged during subsequent processing rendering the semiconductor device inoperable.

In some embodiments, subsequent processing includes forming a channel for a transistor using a channel last process. The channel last process involves removal of a portion of substrate 202 to form openings and epitaxially growing materials in the openings to form the channel. Semiconductor device 200 is then subjected to an annealing process to form the channel. Details of an exemplary channel last process are provided in U.S. patent application Ser. No. 13/446,375, which is incorporated herein by reference in its entirety. In the channel last process, loss of material from ILD layer 206 is a significant threat because of the removal of the portions of substrate 202. Protective layer 210 reduces the risk of material loss from ILD layer 206 to prevent short circuiting between source/drain regions of adjacent transistors formed in semiconductor device 200. Further, the openings in the substrate are subjected to a cleaning process prior to epitaxially growing the materials in the openings. The cleaning process can also cause damage to ILD layer 206. Protective layer 210 also provides protection for ILD layer 206 during the cleaning process to reduce the risk of damage to the ILD layer.

One aspect of this description relates to a method of protecting an interlayer dielectric (ILD) layer. The method includes forming an ILD layer and a dummy gate structure over a substrate and forming a cavity in a top portion of the ILD layer. The method further includes filling the cavity with a protective layer over the ILD layer and the dummy gate structure and planarizing the protective layer, wherein a top surface of the planarized protective layer is level with a top surface of the dummy gate structure.

Another aspect of this description relates to a method of making a semiconductor device. The method includes forming an ILD layer and a dummy gate structure over a substrate and forming a cavity in a top portion of the ILD layer. The method further includes filling the cavity a protective layer formed over the ILD layer and the dummy gate structure and planarizing the protective layer, wherein a top surface of the planarized protective layer is level with a top surface of the dummy gate structure. The method further includes removing the dummy gate structure to form a void and filling the void with a conductive material formed over the ILD layer. The method further includes planarizing the metal gate layer, wherein a top surface of the planarized metal gate layer is level with the top surface of the protective layer.

Still another aspect of this description relates to a semiconductor device. The semiconductor device comprises a substrate, a first gate structure formed on the substrate and a second gate structure formed on the substrate. The semiconductor device further includes an interlayer dielectric (ILD) layer for electrically insulating the first gate structure from the second gate structure formed on the substrate, wherein a top surface of the ILD layer is lower than top surfaces of the first and second gate structures. The semiconductor device further includes a protective layer formed on the ILD layer, the protective layer having a different etch selectivity than the ILD layer, wherein a top surface of the protective layer is level with the top surfaces of the first and second gate structures.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
   a first gate structure;
   a second gate structure;
   an interlayer dielectric (ILD) layer over a substrate for electrically insulating the first gate structure from the second gate structure;
   a protective layer on the ILD layer, the protective layer having a different etch selectivity than the ILD layer, wherein a top surface of the protective layer is level with a top surface of the first gate structure and a top surface of the second gate structure, a thickness of the protective layer is about 20% to about 100% of a thickness of the ILD layer, and the protective layer comprises silicon carbon nitride (SiCN); and
   a contact etch stop layer (CESL) between the substrate and the ILD layer, wherein the protective layer contacts a sidewall of the CESL.

2. The semiconductor device of claim 1, wherein the protective layer has a thickness of about 10 nanometers (nm) to about 20 nm.

3. The semiconductor device of claim 1, further comprising:
   a first electrode layer in the first gate structure; and
   a second electrode layer in the second gate structure, wherein the protective layer has a different etch selectivity than the first electrode layer and the second electrode layer.

4. The semiconductor device of claim 1, wherein a width of the ILD layer ranges from about 25 nanometers (nm) to about 75 nm.

5. The semiconductor device of claim 1, wherein at least one of the first gate structure or the second gate structure is a replacement gate structure.

6. The semiconductor device of claim 1, wherein a width of the protective layer is equal to a width of the ILD layer.

7. The semiconductor device of claim 1, further comprising a silicide region between the ILD layer and the substrate.

8. A method of protecting an interlayer dielectric (ILD) layer, the method comprising:
   forming a gate structure over a substrate;
   forming the ILD layer over the substrate;
   forming a cavity in a top portion of the ILD layer;
   filling the cavity with a protective layer formed over the ILD layer and the gate structure, wherein the protective layer is in direct contact with the gate structure, and the protective layer comprising silicon carbon nitride (SiCN); and
   planarizing the protective layer, wherein a top surface of the planarized protective layer is level with a top surface of the gate structure; and
   replacing the gate structure following planarizing the protective layer.

9. The method of claim 8, wherein the forming the cavity in the top portion of the ILD layer comprises etching the ILD layer to a pre-determined depth.

10. The method of claim 8, wherein the forming the cavity comprises forming the cavity having a depth of about 10 nanometers (nm) to about 20 nm.

11. The method of claim 8, wherein the filling the cavity comprises forming the protective layer having a different etch selectivity than the ILD layer.

12. The method of claim 8, further comprising performing a metallization process after the planarization of the protective layer.

13. The method of claim 8, further comprising forming a silicide region on the substrate, wherein the ILD layer is between a bottom of the cavity and the silicide region.

14. The method of claim 8, wherein forming the cavity comprises forming the cavity having a depth equal to greater than about 20% of a thickness of the ILD layer.

15. A method of protecting an interlayer dielectric (ILD) layer, the method comprising:
   forming a gate structure over a substrate, wherein the gate structure comprises a dummy gate electrode;
   forming the ILD layer over the substrate;
   recessing a top portion of the ILD layer;
   forming a protective layer formed over the recessed ILD layer and over the gate structure, wherein the protective layer directly contacts a top surface of the dummy gate electrode; and
   planarizing the protective layer, wherein a top surface of the planarized protective layer is level with a top surface of the gate structure.

16. The method of claim 15, further comprising replacing the gate structure following planarizing the protective layer.

17. The method of claim 15, wherein forming the protective layer comprises forming the protective layer comprising silicon carbon nitride (SiCN).

18. The method of claim 15, further comprising forming a contact etch stop layer (CESL) over the substrate, wherein forming the CESL comprises forming the CESL between the ILD and the substrate.

19. The method of claim 18, wherein forming the protective layer comprises forming the protective layer in contact with a sidewall of the CESL.

20. The method of claim 18, wherein planarizing the protective layer comprises exposing a top surface of the CESL between the gate structure and the protective layer.

* * * * *